US005786125A

United States Patent [19]

Tsuchiya et al.

[11] Patent Number: 5,786,125

[45] Date of Patent: Jul. 28, 1998

[54] LIGHT-SENSITIVE LITHOGRAPHIC PRINTING PLATE REQUIRING NO FOUNTAIN SOLUTION

[75] Inventors: Mitsumasa Tsuchiya; Tsumoru Hirano, both of Shizuoka, Japan

[73] Assignee: Fuji Photo Film Co., Ltd., Kanagawa, Japan

[21] Appl. No.: 736,499

[22] Filed: Oct. 24, 1996

[30] Foreign Application Priority Data

Oct. 25, 1995 [JP] Japan .................................... 7-277889

[51] Int. Cl.[6] ........................................................ G03F 7/11

[52] U.S. Cl. ......................................... 430/272.1; 430/303

[58] Field of Search ................................. 430/272.1, 303

[56] References Cited

U.S. PATENT DOCUMENTS

| | | | |
|---|---|---|---|
| 5,059,511 | 10/1991 | Higashi et al. | 430/272.1 |
| 5,221,594 | 6/1993 | Takahashi et al. | 430/272.1 |
| 5,232,813 | 8/1993 | Okuno et al. | 430/303 |
| 5,260,167 | 11/1993 | Sasa et al. | 430/272.1 |
| 5,290,665 | 3/1994 | Kii et al. | 430/303 |
| 5,340,699 | 8/1994 | Haley et al. | 430/302 |
| 5,372,907 | 12/1994 | Haley et al. | 430/302 |
| 5,372,915 | 12/1994 | Haley et al. | 430/302 |
| 5,466,557 | 11/1995 | Haley et al. | 430/302 |
| 5,663,037 | 9/1997 | Haley et al. | 430/302 |

*Primary Examiner*—John S. Chu

*Attorney, Agent, or Firm*—Sughrue, Mion, Zinn, Macpeak & Seas, PLLC

[57] ABSTRACT

A support is laminated with a light-sensitive layer and a silicone rubber layer in this order, wherein the light sensitive layer comprises (a) a resol resin, (b) a novolak resin, (c) an infrared absorber, and (d) a compound which generates an acid with heat, thereby providing a light-sensitive lithographic printing plate requiring no fountain solution for direct print-making, which can directly record digital date of computers, etc. with solid lasers or semiconductor lasers having light emitting regions from near infrared to infrared.

4 Claims, No Drawings

LIGHT-SENSITIVE LITHOGRAPHIC PRINTING PLATE REQUIRING NO FOUNTAIN SOLUTION

FIELD OF THE INVENTION

The present invention relates to a light-sensitive lithographic printing plate requiring no fountain solution which is printable without using fountain solution, and more particularly to a light-sensitive lithographic printing plate requiring no fountain solution for direct plate-making, on which images can be directly formed from digital signals of computers, etc.

BACKGROUND OF THE INVENTION

Recent development of lasers is remarkable. In particular, for solid lasers and semiconductor lasers having light emitting regions of from near-infrared to infrared, high power and small-sized ones become easily available. These lasers are very useful as light sources for exposure used in direct plate-making from digital data of computers, etc.

As to high-sensitive lithographic printing plates requiring no fountain solution on which images can be directly formed from digital signals of computers, JP-B-57-3516 (the term "JP-B" as used herein means an "examined Japanese patent publication") and JP-A-53-55211 (the term "JP-A" as used herein means an "unexamined published Japanese patent application") disclose printing plates in which toner images are formed on ink repellent layers formed of silicone resins to form image areas, utilizing electrophotographic techniques. JP-A-54-44905 discloses printing plates laminated with silver salt emulsion layers, which is high sensitive and can be exposed to light having a wide range of wavelengths. Further, printing plates comprising supports laminated with silicone rubber layers in which image areas are formed by discharge breakdown are known in U.S. Pat. No. 4,958,562.

Furthermore, positive type materials require a considerable write time in direct plate-making from digital data of computers by laser light. Negative type materials are therefore advantageous. As the negative type light-sensitive lithographic printing plates requiring no fountain solution, JP-B-61-54222 and JP-B-61-616 propose light-sensitive lithographic printing plates requiring no fountain solution in which silicone rubber layers are formed on support-backed photodecomposable light-sensitive layers formed of o-naphthoquinone. In addition, JP-A-59-17552 and JP-B-3-56223 propose use of similar printing plates as both the positive type and the negative type by controlling processing methods thereof.

In place of them, light-sensitive lithographic printing plates requiring no fountain solution having light-sensitive layers comprising compounds generating acids with light (photo acid generators), compounds hydrolyzed by acids to change its solubility, and if necessary, binder resins have recently been reported. For example, JP-A-63-88556 proposes to expose a light-sensitive lithographic printing plate requiring no fountain solution having on a support a light-sensitive layer comprising a photo acid generator, a C—O—C bond-containing compound decomposable by an acid and a water-insoluble binder, an intermediate layer formed of amorphous silicic acid and a silicone rubber layer in this order, dissolve the light-sensitive layer solubilized by a developing agent to remove it, and concurrently remove the silicone layer formed thereon to expose the support (aluminum substrate), thereby forming an image area. In this case, however, the printing plate is unsuitable for writing using solid lasers or semiconductor lasers having light emitting regions of from near-infrared to infrared, because it is low in sensitivity and many of the practically effective photo acid generators used in this technique only have absorption at 450 nm or less.

SUMMARY OF THE INVENTION

An object of the present invention is to provide a light-sensitive lithographic printing plate requiring no fountain solution which can directly record digital data of computers, etc. by using solid lasers or semiconductor lasers (heat mode), having light emitting regions of from near-infrared to infrared.

According to the present invention, there is provided a light-sensitive lithographic printing plate requiring no fountain solution comprising a support laminated with a light-sensitive layer and a silicone rubber layer in this order, wherein the light sensitive layer comprises (a) a resol resin, (b) a novolak resin, (c) an infrared absorber, and (d) a compound which generates an acid with heat (hereinafter referred to as an "acid precursor").

In the present invention, a positive type or negative type lithographic printing plate requiring no fountain solution is obtained depending on the conditions under which light-sensitive film is prepared. When the positive type lithographic printing plate requiring no fountain solution is prepared, an acid is generated from the acid precursor of the exposed area by image exposure, and the resol component and the novolak component are then reacted with each other by heating to insolubilize an exposed area and to enhance the adhesive property of the silicone rubber layer at the same time, thereby forming a non-image area. On the other hand, when the negative type lithographic printing plate requiring no fountain solution is prepared, the solubility of an exposed area is improved by image exposure and the adhesive property of the silicone rubber layer is decreased at the same time, thereby forming an image area.

Such constitution of the present invention, particularly use of the specified infrared absorber of component (c), provides good sensitivity even when digital data is directly recorded using solid lasers or semiconductor lasers (heat mode). Further, combined use of component (a) and component (b) reduces the write time for both the positive type and the negative type, and simple processing after exposure can provide a good positive or negative image.

DETAILED DESCRIPTION OF THE INVENTION

The present invention will be described in detail below.

The light-sensitive layer used in the present invention is formed of a light-sensitive composition comprising components (a), (b), (c) and (d) described above.

First, the resol resins of component (a) of the present invention are described. Methods for preparing the resol resins are known in the art. In general, the resol resins are obtained by reacting phenol compounds with aldehydes in the presence of alkali catalysts. Useful examples of the phenol compounds include phenol, substituted phenols substituted by alkyl, aryl, etc., cresols, xylenols, bisphenol A and resorcinols. As the aldehydes, formaldehyde is mainly used, although paraformaldehyde, furfural, hexamethylenetetramine, etc. are also used. Specific examples of the resol resins include, but are not limited, phenol resol resins, m-cresol resol resins, p-cresol resol resins, o-cresol resol resins, m-/p-cresol (mixed) resol resins, phenol/cresol resol resins, ethylphenol resol resins, phenylphenol resol resins, p-tertiary butylphenol resol resins, p-tertiary amylphenol resol resins and bisphenol A resol resins. The resol resins used in the present invention can be arbitrarily selected for use alone or as a combination of several kinds of them.

The novolak resins (b) used in the present invention are generally obtained by reacting phenol compounds with aldehydes in the presence of alkali catalysts under conditions different from those of the resol resins. Useful examples of the phenol compounds and the aldehydes include the above-described raw materials used for the resol resins.

Specific examples of the novolak resins include, but are not limited, phenol-novolak resins, m-cresol-novolak resins, p-cresol-novolak resins, o-cresol-novolak resins, m-/p-cresol (mixed)-novolak resins, phenol/cresol-novolak resins, ethylphenol-novolak resins, phenylphenol-novolak resins, p-tertiary butylphenol-novolak resins, p-tertiary amylphenol-novolak resins and bisphenol A-novolak resins. The novolak resins used in the present invention can be arbitrarily selected for use alone or as a combination of several kinds of them.

The weight ratio of component (a) to component (b) used [(a)/(b)] is 10/90 to 95/5.

In the present invention, as the infrared absorbers (c), various known pigments and dyes are used.

As the pigment absorbing infrared rays, carbon black is suitably used. The dyes absorbing infrared rays include cyanine, merocyanine, phthalocyanine, squarylium, metal dithiolene, naphthoquinone and pyrylium dyes. For example, sensitizing dyes described in Matsuoka, *Infrared Sensitizing Dyes*, Plenum Press, New York, N.Y. (1990), cyanine dyes described in JP-A-58-125246, JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875 are preferably used. Particularly preferred examples thereof are near-infrared absorbers described in U.S. Pat. No. 5,156,935, substituted arylbenzo (thio)pyrylium salts described in U.S. Pat. No. 3,881,924, trimethylenethiopyrylium described in JP-A-57-142645, pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475 and pyrylium compounds described in JP-B-5-13514 and JP-B-5-19702.

Other particularly preferred examples thereof include near infrared absorbing dyes represented by formulas (I) and (II) in U.S. Pat. No. 4,756,993.

These pigments or dyes can be added in an amount of 0.01 to 50% by weight, and preferably 0.1 to 20% by weight, based on the total solid content of the light-sensitive layer composition.

As the compounds generating acids with heat (acid precursors) (d) used in the present invention, known acid-generating compounds and mixtures thereof can be suitably selected for use.

Examples thereof include onium salts such as diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069,055 and 4,069,056 and JP-A-4-365049, phosphonium salts described in D. C. Necker et al., *Macromolecules*, 17, 2468 (1984), C. S. Wen et al., *Teh. Proc. Conf. Rad. Curing ASIA*, page 478, Tokyo, October (1988), U.S. Pat. Nos. 4,069,055 and 4,069,056, iodonium salts described in J. V. Crivello et al., *Macromolecules*, 10(6), 1307 (1977), *Chem. & Eng. News, Nov.* 28, page 31 (1988), European Patent 104,143, JP-A-2-150848 and JP-A-2-296514, sulfonium salts described in J. V. Crivello et al., *Polymer J.*, 17, 73 (1985), J. V. Crivello et al., *J. Org. Chem.*, 43, 3055 (1978), W. R. Watt et al, *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci., Polymer Chem. Ed.*, 17, 2877 (1979), European Patents 370,693, 233,567, 297,443 and 297,442, U.S. Pat. Nos. 4,933,377, 4,760,013, 4,734,444 and 2,833,827, German Patents 2,904,626, 3,604,580 and 3,604,581, selenonium salts described in J. V. Crivello et al., *Macromolecules*, 10(6), 1307 (1977) and J. V. Crivello et al., *J. Polymer Sci., Polymer Chem. Ed.*, 17, 1047 (1979), and arsonium salts described in C. S. Wen et al., *Teh. Proc. Conf. Rad. Curing ASIA*, page 478, Tokyo, October (1988); organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metal/organic halogen compounds described in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896) and JP-A-2-161445; photo acid generating agents having o-nitrobenzyl type protective groups described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc., Solid State Sci. Technol.*, 130(6), European Patents 0,290,750, 046,083, 156,535, 271,851 and 0,388,343, U.S. Pat. Nos. 3,901,710 and 4,181,531, JP-A-60-198538 and JP-A-53-133022; compounds which are photodecomposed to generate sulfonic acid, represented by iminosulfonates described in M. Tunooka et al., *Polymer Preprints, Japan*, 38(8), G. Berner et al., *J. Rad. Curing*, 13(4), W. J. Mijs et al., *Coating Technol.*, 55(697), 45 (1983), H. Adachi et al., *Polymer Preprints. Japan*, 37(3), European Patents 0,199,672, 84,515, 199,672, 044,115 and 0,101,122, U.S. Pat. Nos. 4,618,564, 4,371,605 and 4,431,774, JP-A-64-18143, JP-A-2-245756 and JP-A-4-365048; and disulfone compounds described in JP-A-61-166544.

Further, compounds in which these acid-generating groups or compounds are introduced into main chains or side chains of polymers, for example, compounds described in M. E. Woodhouse et al., *J. Am. Chem. Soc.*, 104, 5586 (1982), S. P. Pappas et al., *J. Imaging Sci.*, 30(5), 218 (1986), S. Kondo et al., *Makromol. Chem.*, Rapid Commun., 9625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-1460387, JP-A-63-163452, JP-A-62-153853 and JP-A-63-146029 can be used.

Further, compounds generating acids with light described in V. N. R. Pillai, *Synthesis*, (1), 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126,712 can also be used.

Of the above-described acid precursors, ones particularly effectively used are described below.

(1) Oxazole derivatives represented by the following formula (I) in which trihalomethyl groups are substituted or S-triazine derivatives represented by the following formula (II):

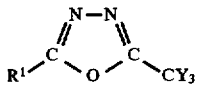

(I)

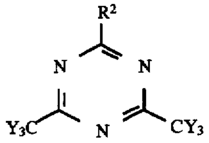

(II)

wherein $R^1$ represents a substituted or unsubstituted aryl or alkenyl group, and $R^2$ represents a substituted or unsubstituted aryl, alkenyl or alkyl group, or $-CY_3$ wherein Y represents a chlorine atom or a bromine atom.

Specific examples of the above-described oxazole derivatives (I) and S-triazine derivatives (II) include, but are not limited, compounds I-1 to I-8 and compounds II-1 to II-10 shown below:

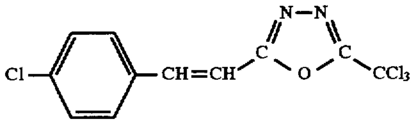

(I-1)

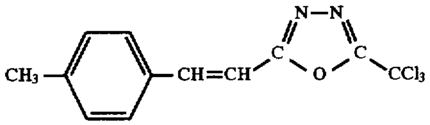

(I-2)

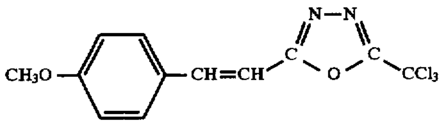

(I-3)

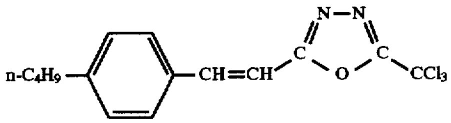

(I-4)

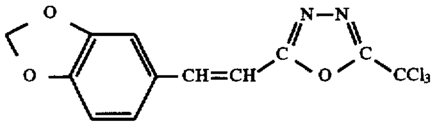

(I-5)

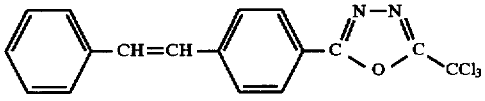

(I-6)

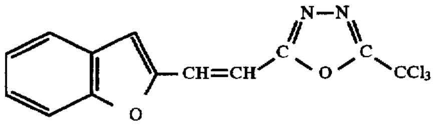

(I-7)

-continued

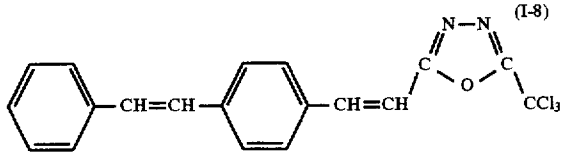

(I-8)

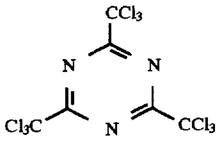

(II-1)

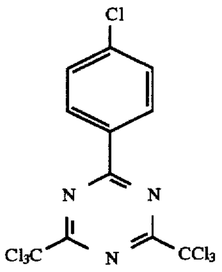

(II-2)

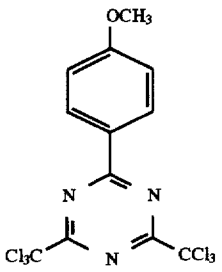

(II-3)

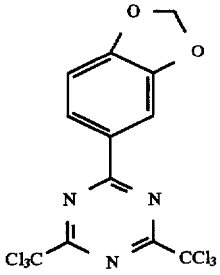

(II-4)

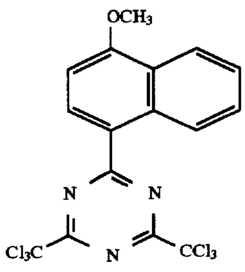

(II-5)

-continued

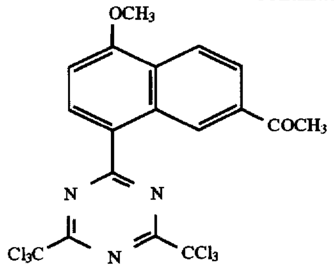
(II-6)

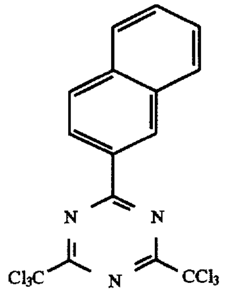
(II-7)

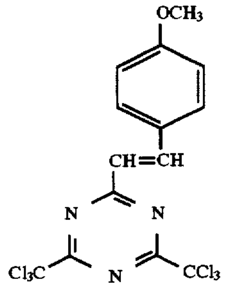
(II-8)

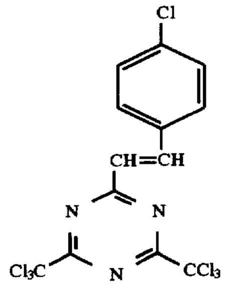
(II-9)

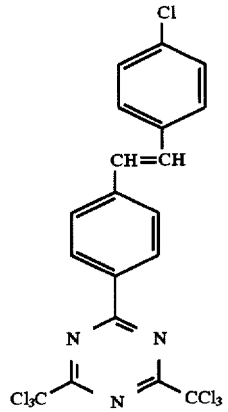
(II-10)

(2) Iodonium salts represented by the following formula (III) or sulfonium salts represented by the following formula (IV):

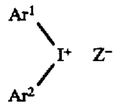
(III)

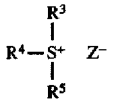
(IV)

wherein $Ar^1$ and $Ar^2$ each independently represent a substituted or unsubstituted aryl group. Preferred examples of the substituents include alkyl groups, haloalkyl groups, cycloalkyl groups, aryl groups, alkoxyl groups, a nitro group, a carboxyl group, alkoxycarbonyl groups, a hydroxyl group, a mercapto group and halogen atoms.

$R^3$, $R^4$ and $R^5$ each independently represent a substituted or unsubstituted alkyl or aryl group, and are preferably an aryl group having 6 to 14 carbon atoms, an alkyl group having 1 to 8 carbon atoms or a substituted derivative thereof. Preferred examples of the substituents include alkoxyl groups having 1 to 8 carbon atoms, alkyl groups having 1 to 8 carbon atoms, a nitro group, a carboxyl group, a hydroxyl group and halogen atoms for the aryl groups, and an alkoxyl group having 1 to 8 carbon atoms, a carboxyl group and alkoxycarbonyl groups for the alkyl groups.

$Z^-$ represents a counter anion, and examples thereof include, but are not limited, $BF_4^-$, $AsF_6^-$, $PF_6^-$, $SbF_6^-$, $SiF_6^-$, $ClO_4^-$, $CF_3SO^-$, $BPh_4^-$ (Ph=phenyl), condensed polynuclear aromatic sulfonic acid anions such as a naphthalene-1-sulfonic acid anion and an anthraquinonesulfonic acid anions, and sulfonic acid group-containing dyes.

Further, two of $R^3$, $R^4$ and $R^5$, or $Ar^1$ and $Ar^2$ may each be linked through a single bond or a substituent.

The above-described onium salts represented by formulas (III) and (IV) are known, and can be synthesized by, for example, methods described in J. W. Knapczyk et al., *J. Am. Chem. Soc.,* 91, 145 (1969), A. L. Maycok et al., *J. Org. Chem.,* 35, 2532 (1970), E. Goethas et al., *Bul. Soc. Chem. Belg.,* 73, 546 (1964), H. M. Leicester, *J. Am. Chem. Soc.,* 51, 3587 (1929), J. B. Crivello et al., *J. Polym. Chem. Ed.,* 18, 2677 (1980), U.S. Pat. Nos. 2,807,648 and 4,247,473 and JP-A-53-101331.

Specific examples of the onium salts represented by formulas (III) and (IV) include, but are not limited, compounds III-1 III-20 and compounds IV-1 to IV-34 shown below:

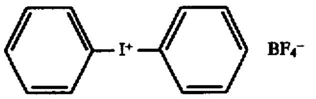
(III-1)

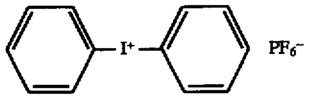
(III-2)

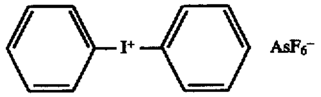
(III-3)

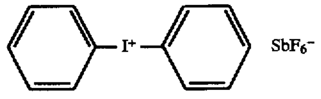
(III-4)

-continued
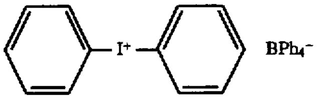
(III-5)
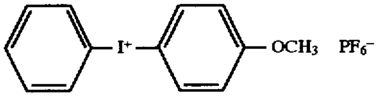
(III-6)
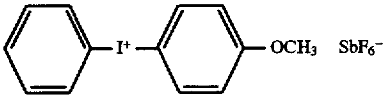
(III-7)
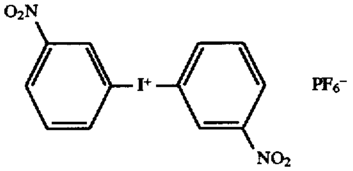
(III-8)
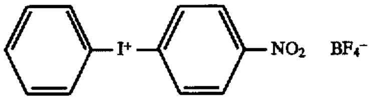
(III-9)
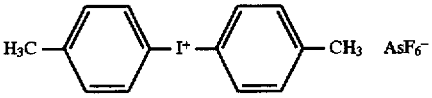
(III-10)
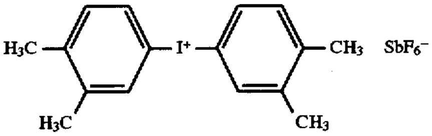
(III-11)
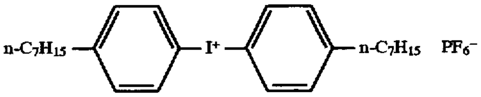
(III-12)
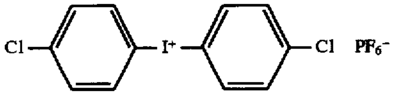
(III-13)
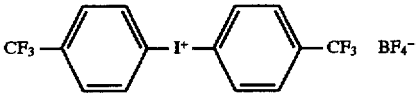
(III-14)
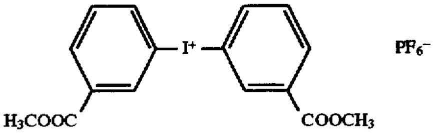
(III-15)
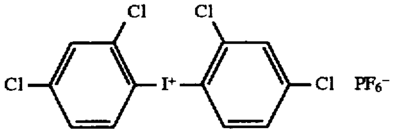
(III-16)
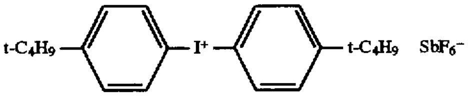
(III-17)
-continued
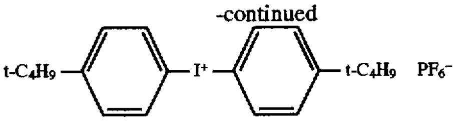
(III-18)
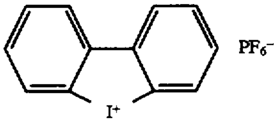
(III-19)
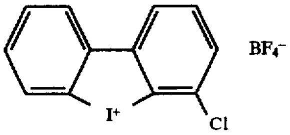
(III-20)
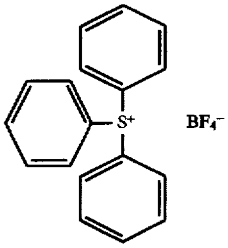
(IV-1)
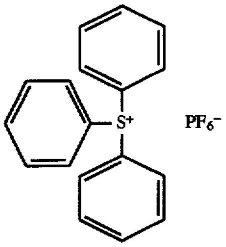
(IV-2)
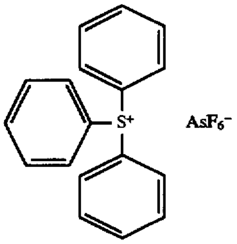
(IV-3)
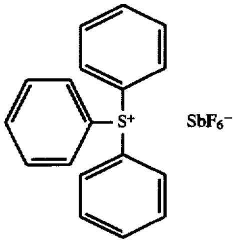
(IV-4)
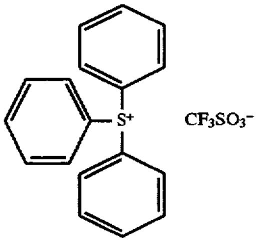
(IV-5)

-continued
(IV-6)
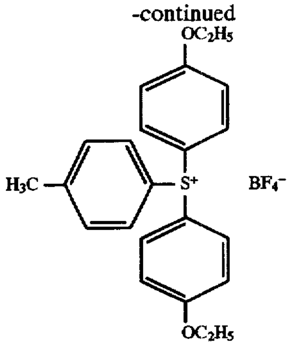
(IV-7)
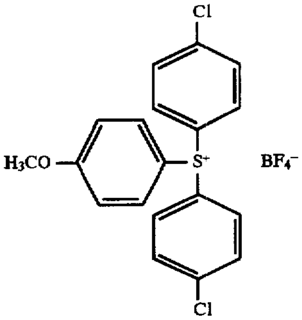
(IV-8)
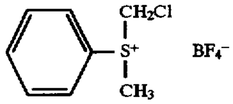
(IV-9)
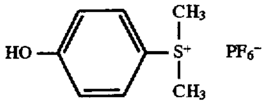
(IV-10)
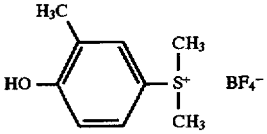
(IV-11)
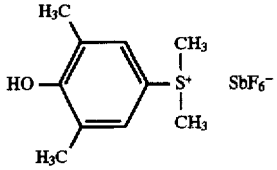
(IV-12)
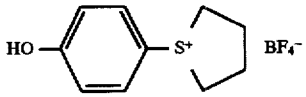
(IV-13)
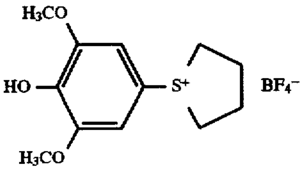
(IV-14)
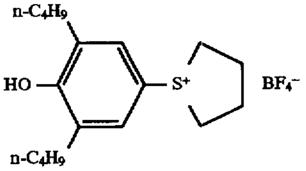
-continued
(IV-15)
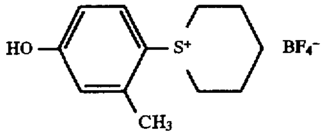
(IV-16)
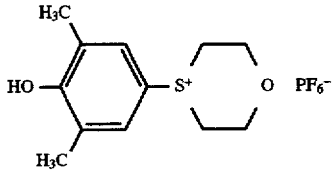
(IV-17)
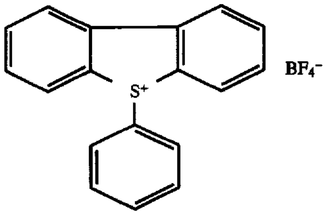
(IV-18)
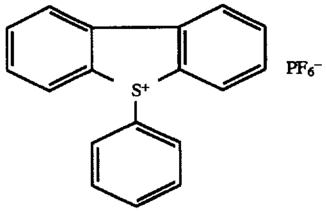
(IV-19)
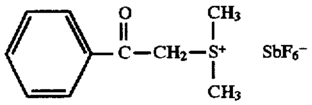
(IV-20)
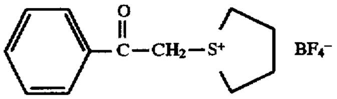
(IV-21)
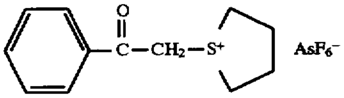
(IV-22)
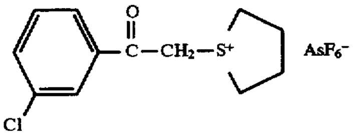
(IV-23)
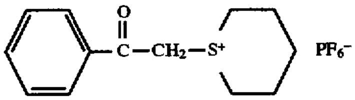
(IV-24)
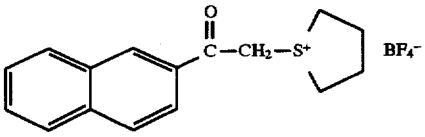
(IV-25)
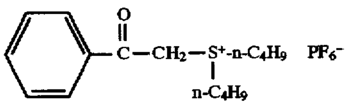

-continued (IV-26)

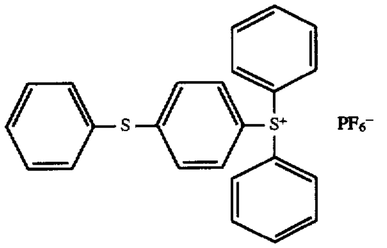

(IV-27)

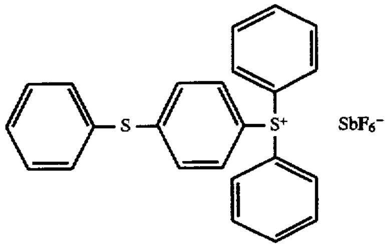

(IV-28)

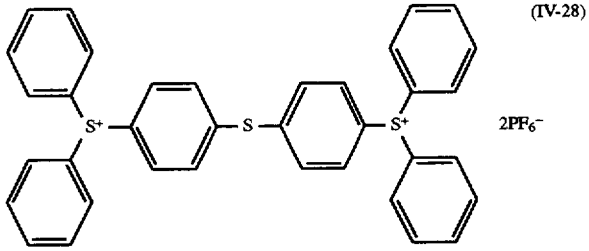

(IV-29)

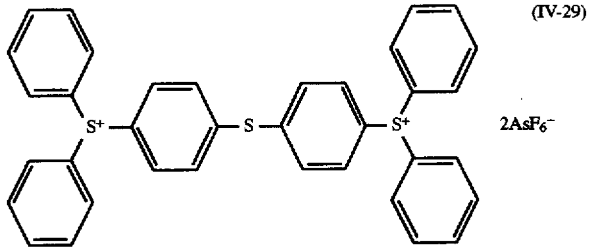

(IV-30)

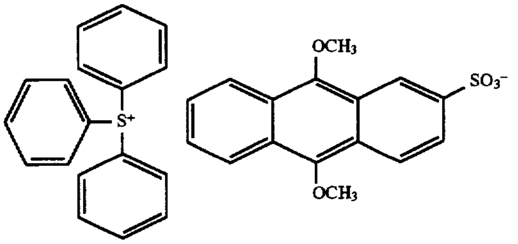

(IV-31)

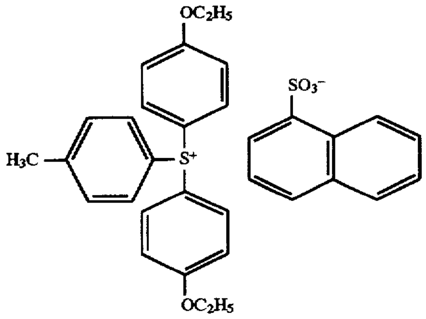

-continued (IV-32)

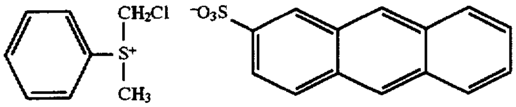

(IV-33)

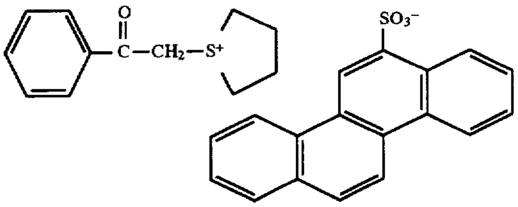

(IV-34)

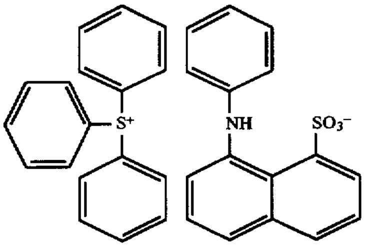

(3) Disulfone derivatives represented by the following formula (V) or iminosulfonate derivatives represented by the following formula (VI)

$$Ar^3—SO_2—SO_2—Ar^4 \quad (V)$$

(VI)

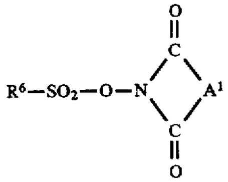

wherein $Ar^3$ and $Ar^4$ each independently represent a substituted or unsubstituted aryl group, $R^6$ represents a substituted or unsubstituted alkyl or aryl group, and $A^1$ represents a substituted or unsubstituted alkylene, alkenylene or arylene group.

Specific examples of the onium salts represented by formulas (V) and (VI) include, but are not limited, compounds V-1 to V-12 and compounds VI-1 to VI-12 shown below:

(V-1)

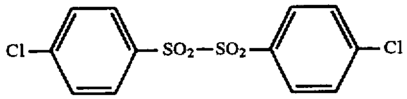

(V-2)

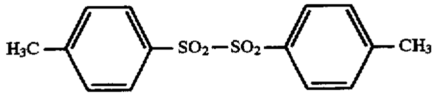

(V-3)

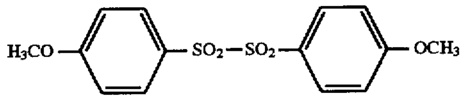

(V-4)

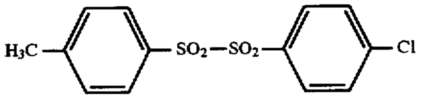

-continued
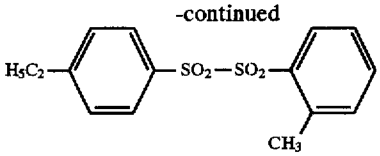
(V-5)
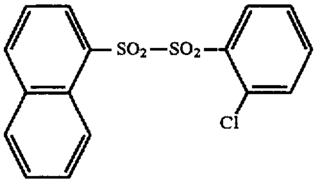
(V-6)
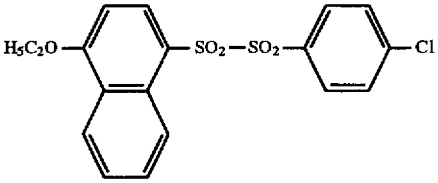
(V-7)
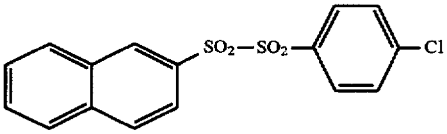
(V-8)
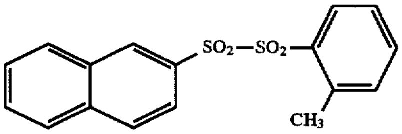
(V-9)
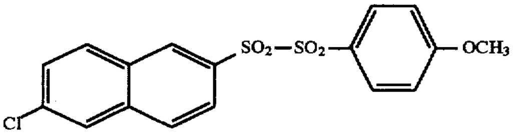
(V-10)
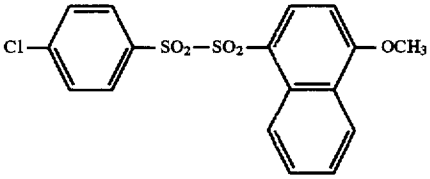
(V-11)
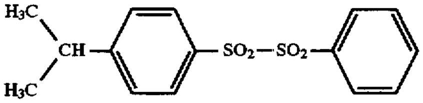
(V-12)
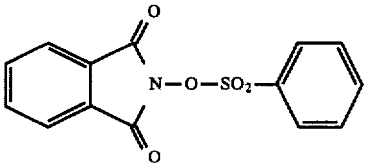
(VI-1)
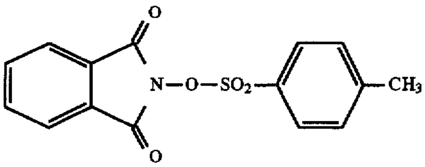
(VI-2)
-continued
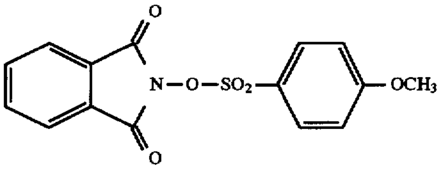
(VI-3)
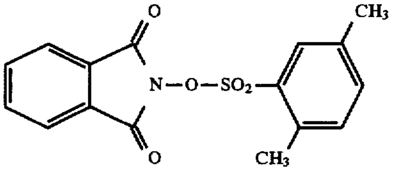
(VI-4)
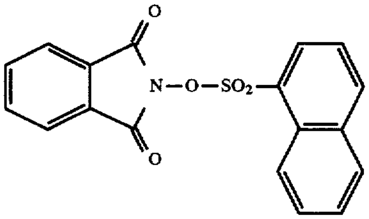
(VI-5)
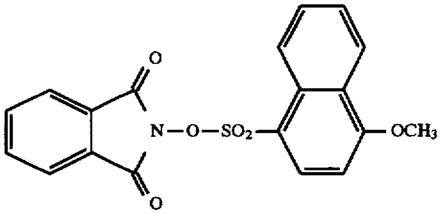
(VI-6)
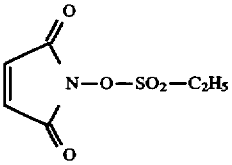
(VI-7)
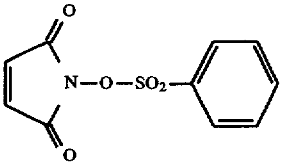
(VI-8)
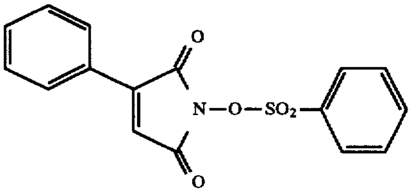
(VI-9)
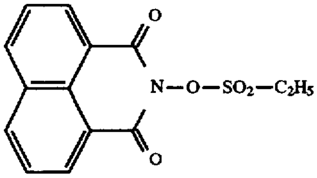
(VI-10)

-continued (VI-11)

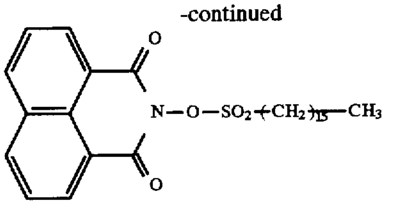

(VI-12)

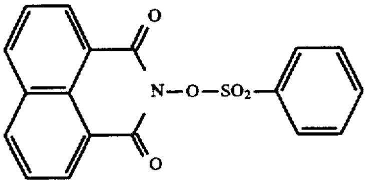

The amount of these acid precursors added is 0.001 to 40% by weight, and preferably 0.1 to 20% by weight, based on the total solid content of the light-sensitive layer composition. If the amount of the acid precursors added is too small, the sensitivity decreases, and if the amount thereof is too large, the sensitivity does not increase above a certain value, resulting in disadvantage in cost.

Printing-out agents for obtaining visible images immediately after exposure include combinations of compounds releasing acids with heat caused by exposure and organic dyes which can form salts. Specific examples of the combinations include combinations of o-naphthoquinonediazido-4-sulfonic acid halogenide and salt-forming organic dyes as described in JP-A-50-36209 and JP-A-53-8128, and combinations of trihalomethyl compounds and salt-forming organic dyes as described in JP-A-53-36223 and JP-A-54-74728. Dyes other than the above-described salt-forming organic dyes can also be used as colorants for images. Preferred examples of the dyes, including the salt-forming organic dyes, are oil-soluble dyes and basic dyes. Specific examples of the dyes include Oil Yellow #101, Oil Yellow #130, Oil Pink #312, Oil Green BG, Oil Blue BOS, Oil Black BY, Oil Black BS and Oil Black T-505 (those dyes are manufactured by Oriental Kagaku Kogyo Co.), Crystal Violet (C142555), Methyl Violet (C142535), Rhodamine B (C145170B), Malachite Green (C142000) and Methylene Blue (C152015).

These dyes can be added to the light-sensitive layer composition in an amount of 0.01 to 10% by weight, and preferably 0.1 to 3% by weight, based on the total solid content of the light-sensitive layer composition. When visible images having a sufficient density are obtained with the infrared absorbers, it is not necessary to add such dyes.

If required and necessary, the light-sensitive layer compositions may contain alkyl ethers (for example, ethyl cellulose and methyl cellulose), silicone surfactants and fluorine surfactants for the purpose of improving the coating properties, plasticizers (for example, tricresyl phosphate, dimethyl phthalate, trioctyl phosphate, tributyl phosphate, tributyl citrate, polyethylene glycol and polypropylene glycol) for the purpose of imparting the flexibility and the wear resistance to films, and additional sensitizers. Further, in order to enhance the adhesive property of the light-sensitive layers to the silicone rubber layers, silane coupling agents, titanium coupling agents, etc. may be added. Although the amount of above additives added varies according to their purpose of use, it is generally 0.3 to 30% by weight based on the total solid content of the light-sensitive layer composition.

The light-sensitive layer composition used in the present invention is dissolved in a solvent which dissolves the above-described respective components, and the resulting solution is used for coating. Examples of the solvents used include ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, ethyl acetate and dioxane. These solvents are used alone or as mixtures thereof.

The concentration of the above-described components (the total solid content including the additives) in the solvent is preferably 2 to 50% by weight. Further, the amount of the solution coated is generally 0.2 to 5.0 $g/m^2$, and preferably 0.3 to 3.0 $g/m^2$, in terms of the solid content.

The support is coated with the coating solution by conventional coating techniques. Examples of the coating techniques which can be used include rotatory coating, wire bar coating, dip coating, air knife coating, roll coating, blade coating, curtain coating and spray coating.

The support used in the present invention is required to have a flexibility to an extent such that it can be set on usual printers and to withstand a loading imposed in printing. Accordingly, representative examples of the support include coated papers, plates of metals such as aluminum, films of plastics such as polyethylene terephthalate, rubbers, and composite materials thereof. Preferred examples of the support are plates of aluminum and plates of aluminum alloys (for example, alloys of aluminum and metals such as silicon, copper, manganese, magnesium, chromium, zinc, lead, bismuth and nickel).

In the present invention, a primer layer may be provided between the support and the light-sensitive layer. Various kinds of primer layers can be used for improving the adhesive property between the support and the light-sensitive layer, preventing halation, and improving dyeing of images and the printing characteristics. Examples of the primer include layers of various light-sensitive polymers exposed to cure them before lamination of the light-sensitive layers as disclosed in JP-A-60-22903, heat-cured epoxy resin layers as disclosed in JP-A-62-50760, cured gelatin layers as disclosed in JP-A-63-133151, layers formed by using urethane resins and silane coupling agents as disclosed in JP-A-3-200965, and urethane resin layers as disclosed in JP-A-3-273248. In addition, cured casein layers are also effective. For the purpose of making the primer layers flexible, polymers having a glass transition temperature of room temperature or less, such as polyurethanes, polyamides, styrene/butadiene rubber, carboxy-modified styrene/butadiene rubber, acrylonitrile/butadiene rubber, carboxylic acid-modified acrylonitrile/butadiene rubber, polyisoprene, acrylate rubber, polyethylene, chlorinated polyethylene and chlorinated polypropylene, may be added to the above-described primer layers. Those polymers may be added in any amount, and the primer layers may be formed of the additives alone so long as the film layers can be formed. In accordance with the above-described purposes, the primer layers can contain additives such as dyes, pH indicators, printing-out agents, photopolymerization initiators, adhesive auxiliaries (for example, polymerizable monomers, diazo resins, silane coupling agents, titanate coupling agents and aluminum coupling agents), pigments, silica powder and titanium powder. Further, the primer layers can also be cured by exposure after coating. In general, the amount of the primer layers coated is 0.1 $g/m^2$ to 20 $g/m^2$ by dry weight, preferably 1 $g/m^2$ to 10 $g/m^2$, and more preferably 1 $g/m^2$ to 5 $g/m^2$.

The crosslinked silicone rubber layers used in the present invention are films formed by curing the following composition A or B:

Composition A

| | | |
|---|---|---|
| (a) | Diorganopolysiloxane (number average molecular weight: 3,000 to 40,000) | 100 parts by weight |
| (b) | Condensation Type Crosslinking Agent | 3 to 70 parts by weight |
| (c) | Catalyst | 0.01 to 40 parts by weight |

The diorganopolysiloxane of the component (1) is a polymer having repeating units represented by the following formula:

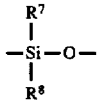

wherein $R^7$ and $R^8$ each represent an alkyl group having 1 to 10 carbon atoms, a vinyl group or an aryl group, which may have another appropriate substituent. In general, it is preferred that 60% or more of $R^7$ and $R^8$ are methyl groups, vinyl halide groups, phenyl halide groups, etc.

Such a diorganopolysiloxane preferably has hydroxyl groups at both ends thereof.

The component (1) has a number average molecular weight of 3,000 to 40,000, and preferably 5,000 to 36,000.

The component (2) may be any one so long as it is of the condensation type, but a compound represented by the following formula is preferred:

$R^7m \cdot Si \cdot Xn$ (m+n=4, n is 2 or more)

wherein $R^7$ has the same meaning as $R^7$ given above, and X is the following substituent:

Halogen such as Cl, Br or I, or

H, OH or an organic substituent such as —$OCOR^9$, —$OR^9$, —O—N=C($R^{10}$)$R^{11}$ or —N($R^{10}$)$R^{11}$ wherein $R^9$ is an alkyl group having 1 to 10 carbon atoms or an aryl group having 6 to 20 carbon atoms, and $R^{10}$ and $R^{11}$ each are an alkyl group having 1 to 10 carbon atoms.

The component (3) is a conventional catalyst such as a carboxylate of a metal such as tin, zinc, lead, calcium or manganese, for example, dibutyltin laurate, lead octylate or lead naphthenate, or chloroplatinic acid.

Composition B

| | | |
|---|---|---|
| (4) | Diorganopolysiloxane Having Addition Reactive Functional Groups (number average molecular weight: 3,000 to 40,000) | 100 parts by weight |
| (5) | Organohydrogenpolysiloxane | 0.1 to 10 parts by weight |
| (6) | Addition Catalyst | 0.00001 to 1 part by weight |

The diorganopolysiloxane having addition reactive functional groups of the component (4) is an organopolysiloxane (having a number average molecular weight of 3,000 to 40,000) having at least two alkenyl groups (preferably, vinyl groups) directly bonded to silicon atoms in a molecule. The alkenyl groups may be positioned either at ends of the molecule or at intermediate portions thereof. The component (4) may have an unsubstituted or substituted alkyl group having 1 to 10 carbon atoms or an aryl group, as an organic group other than the alkenyl groups. Further, the component (4) may also contain hydroxyl groups in slight amount. The number average molecular weight of the component (4) is 3,000 to 40,000, and preferably 5,000 to 36,000.

The component (5) includes, for example, polydimethylsiloxane having hydrogen atoms at both ends, α,ω-dimethylpolysiloxane, a methylsiloxane-dimethylsiloxane copolymer having methyl groups at both ends, cyclic polymethylsiloxane, polymethylsiloxane having trimethylsilyl groups at both ends, and a dimethylsiloxane-methylsiloxane copolymer having trimethylsilyl groups at both ends.

Although the component (6) is arbitrarily selected from conventional catalysts, a platinum compound is particularly preferred. Examples of the platinum compounds include platinum, platinum chloride, chloroplatinic acid and olefin-coordinated platinum. In order to regulate the curing rate of the composition, it is also possible to add a crosslinking inhibitor, for example, a vinyl group-containing organopolysiloxane such as tetracyclo(methylvinyl)siloxane, a carbon-carbon triple bond-containing alcohol, acetone, methyl ethyl ketone, methanol, ethanol or propylene glycol monomethyl ether.

The silicone rubber layers may contain inorganic fine powders such as silica, calcium carbonate and titanium oxide, the above-described adhesive auxiliaries such as silane coupling agents, titanate coupling agents and aluminum coupling agents, and/or photopolymerization initiators, if required and necessary.

The silicone rubber layer used in the present invention functions as a printing ink repellent layer. Accordingly, too small the thickness of the silicone rubber layer causes a decrease in ink repellency and easy development of scratches. On the other hand, too large the thickness results in deterioration of developing properties. The thickness is therefore 0.5 $g/m^2$ to 5 $g/m^2$, and preferably 1 $g/m^7$ to 3 $g/m^2$.

In the light-sensitive lithographic printing plate requiring no fountain solution described herein, the silicone rubber layer may be further coated with various silicone rubber layers.

Further, in order to enhance the adhesion of the light-sensitive layers to the silicone rubber layers, it is preferred that silane or titanate coupling agents are added to the light-sensitive layers or the silicone rubber layers, or that intermediate layers containing the above-described coupling agents are provided between the light-sensitive layers and the silicone rubber layers, thereby enhancing the adhesion of the light-sensitive layers to the silicone rubber layers.

The silane coupling agents used in the present invention include vinylsilanes such as vinyltrichlorosilane, vinyltrimethoxysilane and vinyltriethoxysilane, epoxysilanes such as γ-glycidoxypropyltrimethoxysilane and γ-glycidoxypropyltriethoxysilane, aminosilanes such as γ-aminopropyltriethoxysilane, γ-aminopropyltrimethoxysilane, N-β-(aminoethyl)-γ-aminopropylmethyldiethoxysilane and N-β-(aminoethyl)-γ-aminopropylmethyldimethoxysilane, and (meth) acryloylsilanes such as γ-methacryloxypropylmethoxysilane and γ-methacryloxypropylmethyldiethoxysilane.

The titanate coupling agents used in the present invention include alkyl titanates such as tetra-i-propyl titanate, tetra-n-butyl titanate and tetrastearyl titanate, titanium chelate compounds such as di-i-propoxy-bis(acetylacetonato) titanium, di-n-butoxy-bis(acetonato)titanium, di-n-butoxy·bis(triethanolaminato)titanium and dihydroxy·bis-(lactato)titanium, titanium acylates such as tri-n-butoxytitanium monostearate and titanium tetrabenzoate, and aggregates and polymers thereof. Further, phosphorus-containing titanates including i-propyltri(dioctylphosphate) titanate, bis-(dioctylphosphate) ethylenetitanate, i-propyltris (dioctylpyrophosphate) titanate, bis(dioctylpyrophosphate) oxyacetate titanate and bis(dioctylpyrophosphate) ethylenetitanate can be used.

Further, in order to protect surfaces of tie silicone rubber layers, the silicone rubber layers may be laminated with transparent films formed of polyethylene, polypropylene, polyvinyl chloride, polyvinylidene chloride, polyvinyl alcohol, polyethylene terephthalate, cellophane, etc., or may be coated with these polymers. Stretched films may be used as such films. Furthermore, the matte treatment may be applied to these films.

The light-sensitive lithographic printing plates requiring no fountain solution of the present invention are usually subjected to image exposure and development. Light sources of actinic light used for exposure of the printing plates of the present invention are preferably light sources having light emitting regions from near infrared to infrared. For example, solid lasers and semiconductor lasers are particularly preferred. However, image formation is also possible by use of electron beams, X-rays, ion beams, far ultraviolet rays, etc., as well as ultraviolet rays emitted from mercury lamps, metal halide lamps, xenon lamps, chemical lamps and carbon arc lamps. Further, g-rays, i-rays and deep-UV rays used as light sources for photoresist can also be used. Furthermore, scanning exposure by use of high density energy beams (laser beams and electron beams) can also be used in the present invention. Such laser beams include helium-neon laser beams, argon laser beams, krypton ion laser beams, helium-cadmium laser beams and KrF eximer laser beams.

When the positive lithographic printing plate requiring no fountain solution is prepared in the present invention, heating is conducted after exposure to accelerate the insolubilization reaction with the acids generated from the acid precursors. This heating process is preferably performed within the temperature range from 80° to 150° C. for 5 seconds to 20 minutes.

The light-sensitive lithographic printing plates requiring no fountain solution exposed and subjected to the heating process if necessary are developed with developers which can partly or wholly dissolve or swell the light-sensitive layers of image areas, or with developing agents which can swell the silicone rubber layers. In this case, both the light-sensitive layers of image areas and the silicone rubber layers formed thereon are removed, or only the silicone rubber layers are removed. This can be controlled by the power of the developers.

Conventional developers for light-sensitive lithographic printing plates requiring no fountain solution can be used as the developers used for development of the light-sensitive layer compositions in the present invention. Preferred examples of the developers include aliphatic hydrocarbons (such as hexane, heptane, "Isopar E, G, H" (trade names of aliphatic hydrocarbons manufactured by Esso Kagaku Co.), gasoline and kerosine), aromatic hydrocarbons (such as toluene and xylene), and hydrocarbon halides (such as Trichlene), which are added to the following polar solvents, and the polar solvents themselves.

Alcohols (methanol, ethanol, propanol, benzyl alcohol, ethylene glycol monophenyl ether, 2-methoxyethanol, 2-ethoxyethanol, carbitol monomethyl ether, carbitol monoethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol)

Ketones (acetone and methyl ethyl ketone)

Esters (ethyl acetate, methyl lactate, ethyl lactate, butyl lactate, propylene glycol monomethyl ether acetate, carbitol acetate, dimethyl phthalate and diethyl phthalate)

Others (triethyl phosphate and tricresyl phosphate)

Examples of the developers also include developers in which water is added to the above-described organic solvent type developing solutions, developing solutions in which the above-described organic solvents are solubilized in water by use of surfactants, and developing solutions in which alkali agents (for example, inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia, and organic alkali agents such as tetraalkylammonium halides, monoethanolamine, diethanolamine and triethanolamine) are further added thereto.

Further, only tap water or aqueous alkalis can be used as the developers in some cases.

Furthermore, dyes such as Crystal Violet and Astrazone Red can be added to the developers to dye image areas simultaneously with development.

The development can be conducted by conventional methods such as rubbing of a plate face with a developing pad containing the developer as described above, and rubbing of a plate face with a developing brush after pouring of the developer on the plate face. The temperature of the developers can be arbitrarily selected, but is preferably 10° C. to 50° C.

In order to confirm the image forming properties of the printing plates thus obtained, the exposed image areas can be dyed with dying solutions to make them detectable. When the developer does not contain the dye for dying the exposed image area, the area is dyed with the dying solution after the development. Only the image area is dyed by softly rubbing the image area with a pad impregnated with the dying solution. It can be confirmed thereby whether or not the development is fully performed to highlights. As the dying solution, a solution or a dispersion is used in which one or more dyes selected from water-soluble disperse dyes, acid dyes and basic dyes are dissolved or dispersed in a solvent such as water, an alcohol, a ketone or an ether, or in a mixed solvent of two or more of them. In order to improve the dye affinity, it is also effective to add a carboxylic acid, an amine, a surfactant, a dying auxiliary, an antifoaming agent or the like.

The printing plate dyed with the dying solution is preferably washed with water, followed by drying, which can inhibit the stickiness of the plate surface, resulting in improvement in handling characteristics of the printing plate.

When the printing plates thus treated are stored in piles, interleaving sheets are preferably inserted therebetween to protect the printing plates.

It is preferred that the development processing, the dying processing, and the subsequent washing and drying as described above are conducted with an automatic processor. A preferred example of such an automatic processor is described in JP-A-2-220061.

The present invention will be illustrated in greater detail with reference to examples below, but the invention is not limited thereto. Unless otherwise indicated, all parts, percents, ratios and the like are by weight.

EXAMPLES 1 TO 5

[Preparation of Positive Light-Sensitive Lithographic Printing Plates Requiring No Fountain Solution]

(Preparation of Substrates)

2S aluminum plates having a thickness of 0.24 mm were immersed in a 10% aqueous solution of sodium tertiary phosphate maintained at 80° C. for 3 minutes to degrease them, and sand dressed with a nylon brush. The plates were then etched with sodium aluminate for about 10 minutes, and desmut treated with a 3% aqueous solution of sodium hydrogensulfate. The resulting plates were subjected to anodization in 20% sulfuric acid at a current density of 2 $A/dm^2$ for 2 minutes.

The plates were coated with a coating solution of the following composition so as to give a dry film thickness of 1 μm, heated at 100° C. for 1 minute, and dried to form primer layers.

| | |
|---|---|
| Sanprene IB1700D (manufactured by Sanyo Chemical Industries, Ltd) | 10 parts |
| Hexafluorophosphate of Condensation Product of p-Diazodiphenylamine and Paraformaldehyde | 0.1 part |
| Defenser MFC323 (Surfactant) (manufactured by Dainippon Ink and Chemicals, Inc.) | 0.03 part |
| Propylene Glycol Methyl Ether Acetate | 50 parts |
| Methyl Lactate | 20 parts |
| Pure Water | 1 part |

Those primer layers were exposed for 20 counts using an FT26IV UDNS ULTRA-PLUS FLIPTOP PLATE MAKER vacuum exposing device manufactured by Nu Arc Company.

(Preparation of Carbon Black Dispersion)

| | |
|---|---|
| Carbon Black | 1 part |
| m-Cresol-Formaldehyde Novolak Resin | 1.6 parts |
| Cyclohexanone | 1.6 parts |
| Methoxypropyl Acetate | 3.8 parts |

(Light-Sensitive Layers)

The above-described aluminum plates were coated with light-sensitive solutions having the following compositions, and dried at 90° C. for 1 minute. The weight after drying was 2 $g/m^2$.

| | |
|---|---|
| Carbon Black Dispersion Described Above | 10 parts |
| Bisphenol A-Formaldehyde Resol Resin | 5 parts |
| m-Cresol-Formaldehyde Novolak Resin | 5 parts |
| Acid Precursors Shown in Table 1 | 10 parts |
| Defenser MFC323 (Surfactant) (manufactured by Dainippon Ink and Chemicals, Inc.) | 0.1 part |
| Methyl Ethyl Ketone | 50 parts |

(Silicone Rubber Layers)

The above-described light-sensitive layers were coated with the following silicone rubber composition solution so as to give a dry weight of 2 $g/m^2$, and dried at 100° C. for 2 minutes.

| | |
|---|---|
| α, ω-Divinylpolydimethylsiloxane (polymerization degree: about 700) | 9 parts |
| $(CH_3)_3$—Si—O—$(SiH(CH_3)$—$O)_8$—$Si(CH_3)_3$ | 0.5 part |
| Polydimethylsiloxane | 0.5 part |
| Olefin-Chloroplatinic Acid | 0.08 part |
| Inhibitor (CH≡C—$Si(CH_3)_2OSi(CH_3)_3$) | 0.3 part |
| γ-Methacryloxypropyltrimethoxysilane | 0.3 part |
| Isopar E (manufactured by Esso Kagaku Co.) | 140 parts |

The silicone rubber layers obtained above were each laminated with 8 μm thick biaxially stretched polypropylene films to obtain light-sensitive lithographic printing plates requiring no fountain solution.

The resulting printing plates were exposed with a YAG laser adjusted to 2 W, and the laminated films were peeled off, followed by heating in an oven at 100° C. for 3 minutes. The heated printing plates were immersed in a liquid of tripropylene glycol at 40° C. for 1 minute, and the plate surfaces were then rubbed with a developing pad in water. As a result, positive light-sensitive lithographic printing plates requiring no fountain solution in which silicone rubber remained in exposed areas and the light-sensitive layers were exposed in unexposed areas were obtained in all examples.

TABLE 1

| Example No. | Acid Precursor |
|---|---|
| Example 1 | III-2 |
| Example 2 | V-8 |
| Example 3 | I-2 |
| Example 4 | IV-2 |
| Example 5 | II-2 |

EXAMPLE 6

A light-sensitive lithographic printing plate was obtained in the same manner as in Example 1 except that the carbon black dispersion used in Example 1 was replaced by the following dye:

Dye: 2,6-Di-t-butyl-4-{5-(2,6-di-t-butyl-4H-thiopyrane-4-iridene)-penta-1,3-dienyl}-thiopyrylium tetrafluoroborate (a compound described in U.S. Pat. No. 4,283,475)

0.02 part by weight

The resulting light-sensitive lithographic printing forme was exposed at a linear speed of 8 m/second at 110 mW using a semiconductor laser (wavelength: 825 nm, spot diameter: $1/e^2$=11.9 μm). As a result, a positive light-sensitive lithographic printing plate requiring no fountain solution was obtained.

Comparative Example 1

A printing plate was obtained in the same manner as in Example 6 except that the dye contained in the light-sensitive solution of Example 6 was replaced by 0.02 part of an oil-soluble dye (Victoria Pure Blue-BOH). This printing plate was exposed and developed in the same manner as in Example 6. As a result, the silicone rubber layer was separated at the entire surface, resulting in failure to obtain an image.

EXAMPLE 7

The light-sensitive layer of Example 1 was coated with a silicone rubber solution having the following composition in place of the silicone rubber layer used in Example 1 so as to give a dry weight of 2 $g/m^2$, and dried at 90° C. for 2 minutes. A cover film was provided thereon to obtain a lithographic printing plate requiring no fountain solution.

| | |
|---|---|
| Dimethylpolysiloxane Having Hydroxyl Groups at Both Ends (degree of polymerization: 700) | 9 parts |
| Methyltriacetoxysilane | 0.3 part |
| Trimethoxysilylpropyl-3,5-diallyl Isocyanurate | 0.3 part |
| γ-Aminopropyltrimethoxysilane | 0.3 part |
| Isopar E (manufactured by Esso Kagaku Co.) | 160 parts |

This printing plate was exposed and developed in the same manner as in Example 1. As a result, a positive lithographic printing plate requiring no fountain solution was obtained.

EXAMPLE 8

[Preparation of Negative Light-Sensitive Lithographic Printing Plate Requiring No Fountain Solution]

The primer layer used in Example 1 was coated with a coating solution in which the dye of the coating solution for the light-sensitive layer used in Example 6 was replaced by a compound having the following structural formula, and dried at 120° C. for 2 minutes to obtain a light-sensitive layer having a coverage (coating amount) of 2 g/$m^2$.

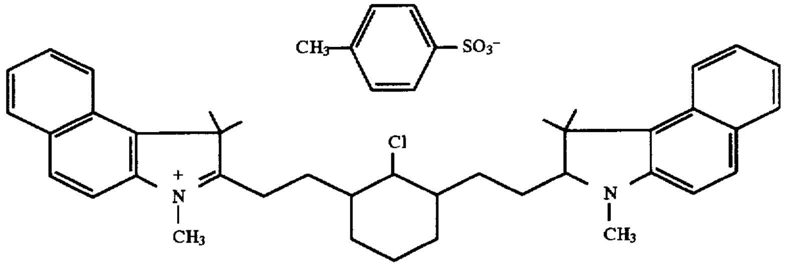

The coating solution for the silicone rubber layer used in Example 1 was applied thereto, and dried at 140° C. for 2 minutes to obtain a silicone rubber layer having a coverage of 2 g/$m^2$.

The silicone rubber layer obtained above was laminated with a 6 μm thick polyethylene terephthalate film to obtain a light-sensitive lithographic printing plate requiring no fountain solution.

The resulting printing plate was exposed with a YAG laser adjusted to 2 W, and the laminated film was then peeled off. The printing plate was immersed in a liquid of tripropylene glycol at 40° C. for 1 minute, and the plate surface was then rubbed with a developing pad in water. As a result, a negative lithographic printing plate requiring no fountain solution was obtained in which silicone rubber remained in an unexposed area and the light-sensitive layer was exposed in an exposed area.

Comparative Example 2

A printing plate was prepared in the same manner as in Example 8 except that the dye contained in the light-sensitive solution of Example 8 was replaced by 0.02 part of an oil-soluble dye (Victoria Pure Blue-BOH). This printing plate was exposed and developed in the same manner as in Example 8. As a result, the silicone rubber layer was not separated at the entire surface, resulting in failure to obtain an image.

The light-sensitive lithographic printing plates requiring no fountain solution of the present invention can directly record digital data of computers, etc. by use of solid lasers or semiconductor lasers having light emitting regions from near infrared to infrared, and can be used as both the positive working and the negative working.

While the invention has been described in detail and with reference to specific embodiments thereof, it will be apparent to one skilled in the art that various changes and modifications can be made therein without departing from the spirit and scope thereof.

What is claimed is:

1. A light-sensitive lithographic printing plate requiring no fountain solution comprising a support laminated with a light-sensitive layer and a silicone rubber layer in this order, wherein said light sensitive layer comprises (a) a resol resin, (b) a novolak resin, (c) an infrared absorber, and (d) a compound which generates an acid with heat.

2. The plate as claimed in claim 1, wherein the component (a) and component (b) are used in amounts such that the weight ratio of (a)/(b) is 10/90 to 95/5.

3. The plate as claimed in claim 1, wherein the infrared absorber is used in an amount of 0.01 to 50% by weight based on a total solid content of the light-sensitive layer composition.

4. The plate as claimed in claim 1, wherein the component (d) is used in an amount of 0.001 to 40% by weight based on a total solid content of the light-sensitive layer composition.

* * * * *